United States Patent
Lee et al.

(10) Patent No.: US 9,607,768 B2
(45) Date of Patent: Mar. 28, 2017

(54) MULTILAYER CERAMIC CAPACITOR AND CIRCUIT BOARD HAVING THE SAME

(71) Applicant: SAMSUNG ELECTRO-MECHANICS CO., LTD., Suwon-Si, Gyeonggi-Do (KR)

(72) Inventors: Byoung Hwa Lee, Suwon-Si (KR); Jin Man Jung, Suwon-Si (KR); Jin Woo Lee, Suwon-Si (KR); Eun Sang Na, Suwon-Si (KR); Young Don Choi, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 244 days.

(21) Appl. No.: 14/335,613

(22) Filed: Jul. 18, 2014

(65) Prior Publication Data
US 2015/0302992 A1    Oct. 22, 2015

(30) Foreign Application Priority Data

Apr. 21, 2014 (KR) ........................ 10-2014-0047610

(51) Int. Cl.
*H01G 4/30* (2006.01)
*H01G 4/00* (2006.01)
(Continued)

(52) U.S. Cl.
CPC ............... *H01G 4/30* (2013.01); *H01G 2/065* (2013.01); *H01G 4/012* (2013.01); *H01G 4/12* (2013.01);
(Continued)

(58) Field of Classification Search
CPC .......... H01G 2/065; H01G 4/012; H01G 4/30; H05K 1/181; H05K 1/185; H05K 2201/10015; H05K 2201/10636
(Continued)

(56) References Cited

U.S. PATENT DOCUMENTS

| 4,419,714 A * | 12/1983 | Locke ...................... H01G 4/30 257/701 |
| 6,441,459 B1 | 8/2002 | Togashi et al. |

(Continued)

FOREIGN PATENT DOCUMENTS

| JP | 2002-100875 A | 4/2002 |
| JP | 2008-71811 | 3/2008 |

(Continued)

OTHER PUBLICATIONS

Korean Office Action dated Sep. 10, 2015 issued in Korean Patent Application No. 10-2014-0047610 (English translation).

*Primary Examiner* — William H Mayo, III
*Assistant Examiner* — Rhadames J Alonzo Miller
(74) *Attorney, Agent, or Firm* — McDermott Will & Emery LLP (57) ABSTRACT

A multilayer ceramic capacitor includes first through fourth internal electrodes. The first and second internal electrodes are connected to first and second external electrodes, respectively, and disposed to face each other. The third and fourth internal electrodes are connected to the first and second external electrodes, respectively, and disposed to face each other, with a connection area of the third and fourth internal electrodes with the first and second external electrodes being different from the connection area where the first and second internal electrodes connect with the first and second external electrodes. The first and second external electrodes include first and second conductive layers disposed in inner portions (Continued)

thereof, and first and second conductive resin layers disposed in outer portions thereof, respectively.

8 Claims, 11 Drawing Sheets (51) Int. Cl.
  *H05K 1/16* (2006.01)
  *H01G 4/012* (2006.01)
  *H01G 4/12* (2006.01)
  *H01G 2/06* (2006.01)
  *H05K 1/18* (2006.01)

(52) U.S. Cl.
  CPC ............ *H05K 1/181* (2013.01); *H05K 1/185* (2013.01); *H05K 2201/10015* (2013.01); *H05K 2201/10636* (2013.01); *Y02P 70/611* (2015.11)

(58) Field of Classification Search
  USPC ............................. 174/260; 361/301.1, 301.4
  See application file for complete search history.

(56) References Cited

U.S. PATENT DOCUMENTS

| | | | | |
|---|---|---|---|---|
| 7,016,176 B1* | 3/2006 | Sundstrom | ............ | H01G 2/065 29/25.41 |
| 8,238,116 B2* | 8/2012 | Eggerding | ............ | H01G 4/012 361/301.4 |
| 2004/0042155 A1* | 3/2004 | Ritter | ........................ | H01G 4/30 361/309 |
| 2007/0002519 A1* | 1/2007 | Li | ........................ | H01G 4/255 361/303 |
| 2007/0165361 A1* | 7/2007 | Randall | .................... | H01G 4/30 361/306.3 |
| 2008/0174934 A1* | 7/2008 | Togashi | ................... | H01G 4/012 361/303 |
| 2008/0253059 A1* | 10/2008 | Eggerding | .............. | H01G 4/012 361/301.4 |
| 2008/0310076 A1* | 12/2008 | Ritter | ........................ | H01G 2/06 361/302 |
| 2008/0310078 A1* | 12/2008 | Lee | ......................... | H01G 4/232 361/306.3 |
| 2010/0067170 A1 | 3/2010 | Koga | | |
| 2010/0188799 A1* | 7/2010 | Galvagni | .............. | H01G 4/012 361/306.3 |
| 2010/0243307 A1* | 9/2010 | McConnell | ........... | H01G 4/232 174/260 |
| 2013/0050893 A1* | 2/2013 | Kim | ........................ | H01G 4/228 361/306.3 |
| 2013/0107421 A1* | 5/2013 | Zenzai | .................... | H01G 4/12 361/321.1 |
| 2013/0229749 A1 | 9/2013 | Lee et al. | | |

FOREIGN PATENT DOCUMENTS

| | | |
|---|---|---|
| JP | 2010-73780 A | 4/2010 |
| JP | 2013-118356 A | 6/2013 |
| KR | 10-2013-0101319 A | 9/2013 |

* cited by examiner

MULTILAYER CERAMIC CAPACITOR AND CIRCUIT BOARD HAVING THE SAME

CROSS-REFERENCE TO RELATED APPLICATION

This application claims the benefit of Korean Patent Application No. 10-2014-0047610 filed on Apr. 21, 2014, with the Korean Intellectual Property Office, the disclosure of which is incorporated herein by reference.

BACKGROUND

The present disclosure relates to a multilayer ceramic capacitor and a circuit board having the same.

A multilayer ceramic capacitor, a multilayer chip electronic component, is mounted on boards of various electronic products such as display devices including liquid crystal displays (LCDs), plasma display panels (PDPs), and the like, computers, personal digital assistants (PDAs), smart phones, mobile phones, and the like, to charge and discharge electricity.

Since multilayer ceramic capacitors (MLCCs) have advantages such as a relatively small size, high capacitance, ease of mounting, and the like, they may be used as components in various electronic devices.

In the case in which a multilayer ceramic capacitor having low equivalent series resistance (ESR) is used in a power circuit, an oscillating phenomenon may occur in the power circuit due to low ESR characteristics.

In the case of increasing the ESR of the multilayer ceramic capacitor in order to prevent the oscillating phenomenon, equivalent series inductance (ESL) may be relatively increased, and thus, electrical characteristics of the multilayer ceramic capacitor may deteriorate.

RELATED ART DOCUMENT (Patent Document 1) U.S. Pat. No. 6,441,459

SUMMARY

An exemplary embodiment in the present disclosure may provide a multilayer ceramic capacitor capable of solving problems of an oscillating phenomenon resulting from low equivalent series resistance (ESR) in a power circuit, and deterioration in electrical characteristics of a multilayer ceramic capacitor caused by a relative increase in equivalent series inductance (ESL) due to high ESR, and a circuit board having the same.

According to an exemplary embodiment in the present disclosure, the multilayer ceramic capacitor may include: a ceramic body in which a plurality of dielectric layers are stacked in a thickness direction; first and second external electrodes disposed on both end surfaces of the ceramic body; first and second internal electrodes connected to the first and second external electrodes, respectively, and disposed to face each other; and third and fourth internal electrodes connected to the first and second external electrodes, respectively, and disposed to face each other, a connection area of the third and fourth internal electrodes with the first and second external electrodes being different from that of the first and second internal electrodes with the first and second external electrodes, wherein the first and second external electrodes may include first and second conductive layers disposed in inner portions thereof and first and second conductive resin layers disposed in outer portions thereof, respectively.

The first and second internal electrodes may be stacked to form a first and second internal electrode part; and the third and fourth internal electrodes may be stacked to form a third and fourth internal electrode part which is disposed above and below the first and second internal electrode part.

The first and second external electrodes may be extended to portions of side surfaces of the ceramic body and may be extended to portions of main surfaces of the ceramic body.

The third and fourth internal electrodes may have a lead part exposed to the side surfaces of the ceramic body to be connected to the first and second external electrodes, and may be spaced apart from the end surfaces of the ceramic body to thereby be connected to the first and second external electrodes through the lead part.

The third and fourth internal electrodes may be connected to the first and second external electrodes through the lead part and portions thereof exposed to one end surface of the ceramic body.

When an end of a portion of the first or second conductive resin layer extended to the side surface of the ceramic body is defined as A, a distance from A to the lead part may be 30 µm or greater.

According to an exemplary embodiment in the present disclosure, in a circuit board in which the multilayer ceramic capacitor is embedded, the multilayer ceramic capacitor may include: a ceramic body in which a plurality of dielectric layers are stacked in a thickness direction; first and second external electrodes disposed on both end surfaces of the ceramic body; first and second internal electrodes connected to the first and second external electrodes, respectively, and disposed to face each other; and third and fourth internal electrodes connected to the first and second external electrodes, respectively, and disposed to face each other, a connection area of the third and fourth internal electrodes with the first and second external electrodes being different from that of the first and second internal electrodes with the first and second external electrodes, and the first and second external electrodes including first and second conductive layers disposed in inner portions thereof and first and second conductive resin layers disposed in outer portions thereof, respectively.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Multilayer Ceramic Capacitor to be Embedded in Circuit Board

Figure 1:
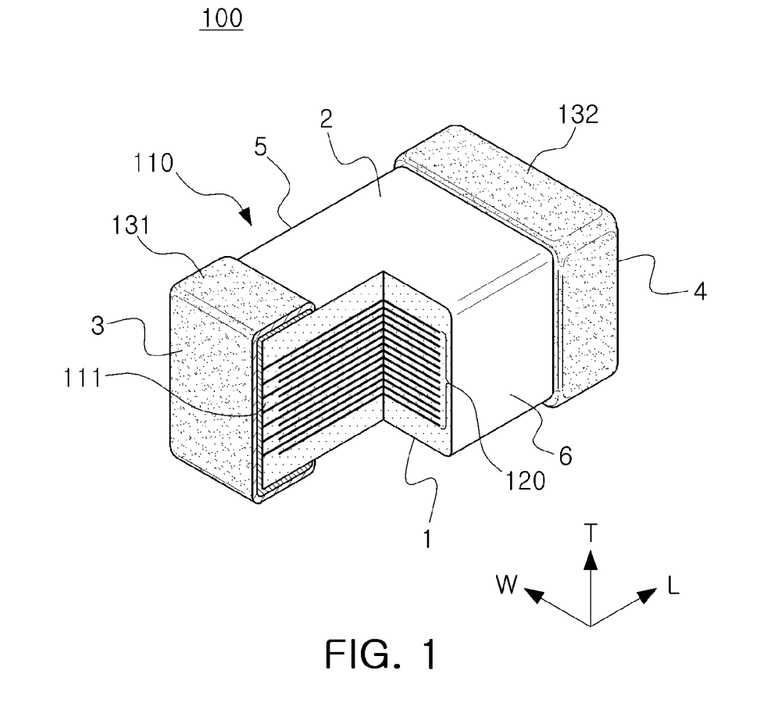
FIG. 1 is a partially cut-away perspective view of a multilayer ceramic capacitor according to an exemplary embodiment of the present disclosure.
Figure 2A:
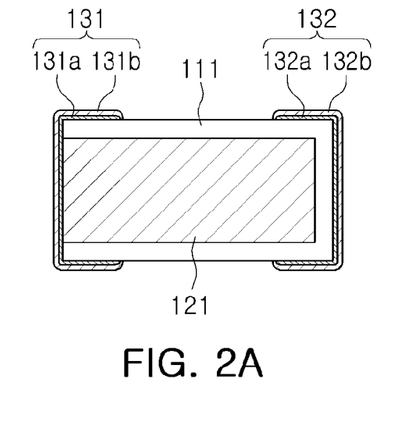
FIGS. 2A through 2D are cross-sectional plan views showing dispositions and connections of first to fourth internal electrodes and first and second external electrodes in a multilayer ceramic capacitor according to a first exemplary embodiment of the present disclosure.
Figure 2B:
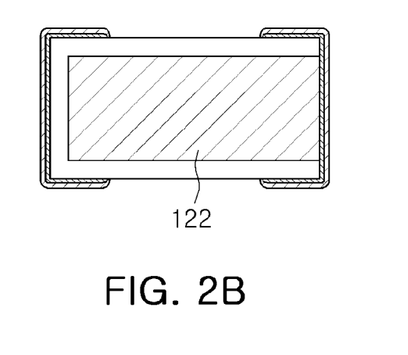
Figure 2C:
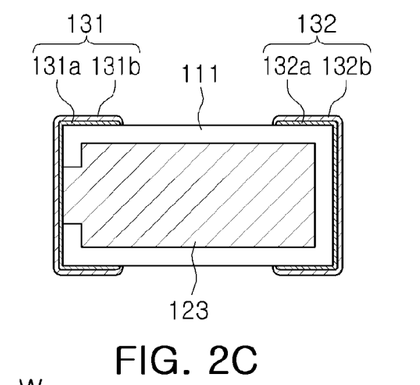
Figure 2D:
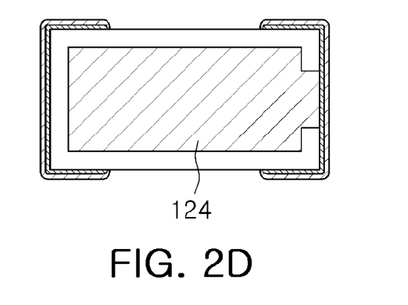

FIG. 1 is a partially cut-away perspective view of a multilayer ceramic capacitor 100 according to an exemplary embodiment of the present disclosure.

In the exemplary embodiment of the present disclosure, surfaces of a ceramic body 110 opposing each other in a thickness direction may be defined as first and second main surfaces 1 and 2, surfaces of the ceramic body 110 connecting the first and second main surfaces to each other and opposing each other in a length direction may be defined as first and second end surfaces 3 and 4, and surfaces of the ceramic body 110 opposing each other in a width direction may be defined as first and second side surfaces 5 and 6.

The ceramic body 110 may be formed by stacking a plurality of dielectric layers 111 in the thickness direction and then sintering the stacked dielectric layers 111.

However, the shape and dimension of the ceramic body 110 and the number of stacked dielectric layers 111 are not limited to those illustrated in the present exemplary embodiment.

In this case, the plurality of dielectric layers 111 forming the ceramic body 110 may be in a sintered state.

Therefore, adjacent dielectric layers 111 may be integrated with each other so that boundaries therebetween are not readily apparent without a scanning electron microscope (SEM).

The dielectric layers 111 may contain a ceramic material having high permittivity.

For example, the dielectric layers 111 may contain barium titanate ($BaTiO_3$) based ceramic powder, or the like, but the material of the dielectric layers 111 is not limited thereto as long as sufficient capacitance may be obtained.

In addition, if necessary, the dielectric layers 111 may contain a ceramic additive, an organic solvent, a plasticizer, a binder, a dispersant, and the like, in addition to the ceramic material.

Here, various kinds of ceramic additives such as transition metal oxides or carbides, a rare earth element, magnesium (Mg), aluminum (Al), or the like, may be used.

A plurality of first to fourth internal electrodes 121 to 124 may be electrically insulated from each other by the dielectric layers 111 disposed therebetween. Each of the first to fourth internal electrodes 121 to 124 may be formed by printing a conductive paste containing a conductive metal on at least one surface of a ceramic sheet forming the dielectric layer 111.

The conductive metal of the conductive paste may be, for example, silver (Ag), palladium (Pd), platinum (Pt), nickel (Ni), and copper (Cu), an alloy thereof, or the like, but is not limited thereto.

In addition, as a method of printing the conductive paste, a screen printing method, a gravure printing method, or the like, may be used, but the present disclosure is not limited thereto.

First and second external electrodes 131 and 132 may be formed of a conductive paste containing a conductive metal, but are not limited thereto.

FIGS. 2A through 2D are cross-sectional plan views showing dispositions and connections of first to fourth internal electrodes and first and second external electrodes in a multilayer ceramic capacitor embedded in a circuit board according to a first exemplary embodiment of the present disclosure. In detail, FIGS. 2A through 2D are cross-sectional plan views showing the first to fourth internal electrodes stacked on dielectric layers, respectively, taken in a length-width direction.

Referring to FIGS. 2A through 2D, a multilayer ceramic capacitor 100 according to the first exemplary embodiment of the present disclosure may include a ceramic body 110 in which a plurality of dielectric layers 111 are stacked in a thickness direction; first and second external electrodes 131 and 132 formed on both end portions of the ceramic body 110; first and second internal electrodes 121 and 122 connected to the first and second external electrodes 131 and 132, respectively, and disposed to face each other in the ceramic body 110; and third and fourth internal electrodes 123 and 124 connected to the first and second external electrodes 131 and 132, respectively, and disposed to face each other in the ceramic body 110, a connection area of the third and fourth internal electrodes 123 and 124 with the first and second external electrodes 131 and 132 being different from that of the first and second internal electrodes 121 and 122 with the first and second external electrodes 131 and 132, and the first and second external electrodes 131 and 132 include first and second conductive layers 131a and 132a disposed in an inner portion thereof, and first and second conductive resin layers 131b and 132b disposed in an outer portion thereof, respectively.

The ceramic body 110 may have an internal electrode part 120 in which the first to fourth internal electrodes 121 to 124 are disposed to face each other and stacked with each of the dielectric layers 111 interposed therebetween. The first and third internal electrodes 121 and 123 may be connected to the first external electrode 131 to have the same polarity. Similarly, the second and fourth internal electrodes 122 and 124 may be connected to the second external electrode 132 to have the same polarity. Therefore, the polarity of the first and third internal electrodes 121 and 123 may be different from that of the second and fourth internal electrodes 122 and 124.

The plurality of first to fourth internal electrodes 121 to 124 may be stacked with each of the dielectric layers 111 interposed therebetween inside the ceramic body 110 in the thickness direction of the ceramic body 110.

The first and second external electrodes 131 and 132, power connection terminals, may be formed on the first and second end surfaces of the ceramic body 110, respectively, to face each other. The first and second external electrodes 131 and 132 of the multilayer ceramic capacitor 100 according to the exemplary embodiment of FIG. 1 may be extended from the first and second end surfaces of the ceramic body 110 to portions of the first and second main surfaces and the first and second side surfaces. However, disposition of the first and second external electrodes 131 and 132 is not limited to that illustrated in FIG. 1.

The first and second external electrodes 131 and 132 may be electrically connected to one end portions of the first to fourth internal electrodes 121 to 124 exposed to the first and second end surfaces of the ceramic body 110.

In this case, the connection area of the first and second internal electrodes 121 and 122 with the first and second external electrodes 131 and 132 may be different from the connection area of the third and fourth internal electrodes 123 and 124 with the first and second external electrodes 131 and 132. Equivalent series resistance (ESR) and equivalent series inductance (ESL) of the multilayer ceramic capacitor 100 may be controlled by adjusting shapes and dispositions of the first to fourth internal electrodes 121 to 124 and the connection areas of the first to fourth internal electrodes 121 to 124 with the first and second external electrodes 131 and 132.

In the case of increasing internal electrode resistance by adjusting the shapes of the first to fourth internal electrodes 121 to 124 and the connection areas of the first to fourth internal electrodes 121 to 124 with the first and second external electrodes 131 and 132, ESR may be increased. On the contrary, in the case of reducing internal electrode resistance, ESR may be reduced. In the case in which the connection area is increased, internal electrode resistance may be reduced, resulting in reduced ESR. In the case in which the connection area is decreased, internal electrode resistance is increased, resulting in increased ESR. In the case in which a current path is lengthened by adjusting the shapes and dispositions of the first to fourth internal electrodes 121 to 124 and the connection areas of the first to fourth internal electrodes 121 to 124 with the first and second external electrodes 131 and 132, ESL may be increased. On the contrary, in the case in which the current path is shortened, ESL may be reduced.

Generally, in the case in which a multilayer ceramic capacitor having low ESR is used in a power circuit, an oscillating phenomenon may occur in the power circuit due to low ESR characteristics. Here, in the case of increasing ESR of the multilayer ceramic capacitor in order to prevent the oscillating phenomenon, ESL may be relatively increased, and thus, the electrical characteristics of the multilayer ceramic capacitor may deteriorate. Therefore, the adjustment of ESR and ESL is required in the multilayer ceramic capacitor.

Since the current path of the multilayer ceramic capacitor 100 according to the exemplary embodiment of the present disclosure may be adjusted depending on the dispositions of the first to fourth internal electrodes 121 to 124, ESR of the multilayer ceramic capacitor 100 may be increased and an increase in ESL may be minimized, whereby the electrical characteristics of the multilayer ceramic capacitor 100 may be improved.

Figure 3:
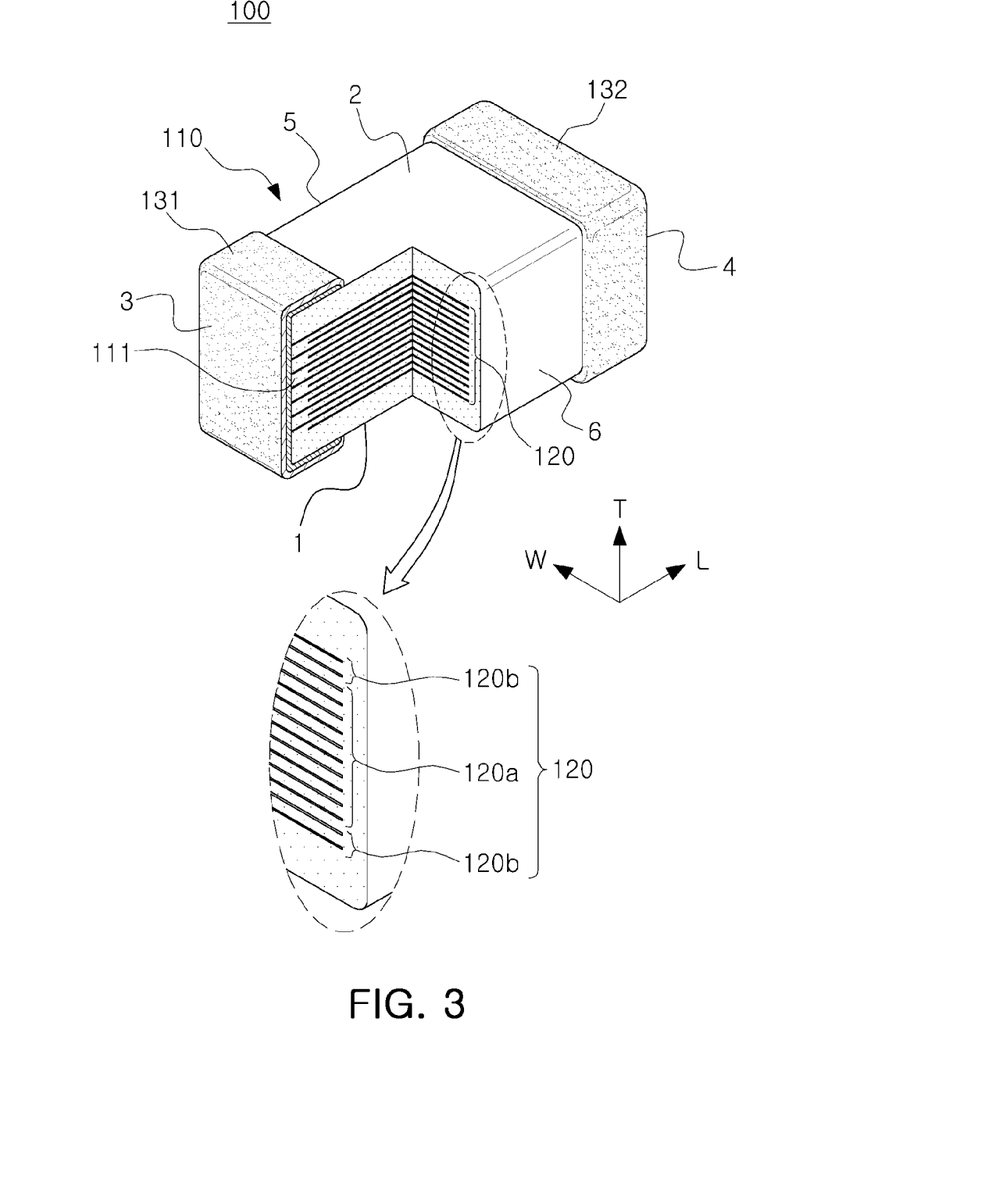
FIG. 3 is a partially cut-away perspective view of a multilayer ceramic capacitor according to a second exemplary embodiment of the present disclosure.

FIG. 3 is a partially cut-away perspective view of a multilayer ceramic capacitor according to a second exemplary embodiment of the present disclosure.

Referring to FIG. 3, the multilayer ceramic capacitor according to the second exemplary embodiment of the present disclosure may have a first and second internal electrode part 120a including the first and second internal electrodes 121 and 122 and a third and fourth internal electrode part 120b disposed above and below the first and second internal electrode part 120a and including the third and fourth internal electrodes 123 and 124.

A portion of the ceramic body 110 in which the plurality of first and second internal electrodes 121 and 122 are alternately stacked may be defined as the first and second internal electrode part 120a. The third and fourth internal electrodes 123 and 124 may be disposed above and below the first and second internal electrode part 120a. In this case, a portion of the ceramic body 110 in which the third and fourth internal electrodes 123 and 124 are alternately stacked may be defined as the third and fourth internal electrode part 120b.

As described above, since the first and second internal electrode part 120a, in which the first and second internal electrodes 121 and 122 are alternately stacked, and the third and fourth internal electrode part 120b, in which the third and fourth internal electrodes 123 and 124 are alternately stacked, are separately disposed in the ceramic body, ESR of the multilayer ceramic capacitor 100 may be adjusted by adjusting the shapes of the first and second internal electrode part 120a and the third and fourth internal electrode part 120b and connection areas with the first and second external electrodes 131 and 132, and ESL of the multilayer ceramic capacitor 100 may be easily adjusted by adjusting dispositions of the first and second internal electrode part 120a, the third and fourth internal electrode part 120b, and the first and second external electrodes 131 and 132. Therefore, the ESR of the multilayer ceramic capacitor 100 may be increased, but an increase in ESL may be minimized, whereby the electrical characteristics of the embedded multilayer ceramic capacitor 100 may be improved.

Figure 4A:
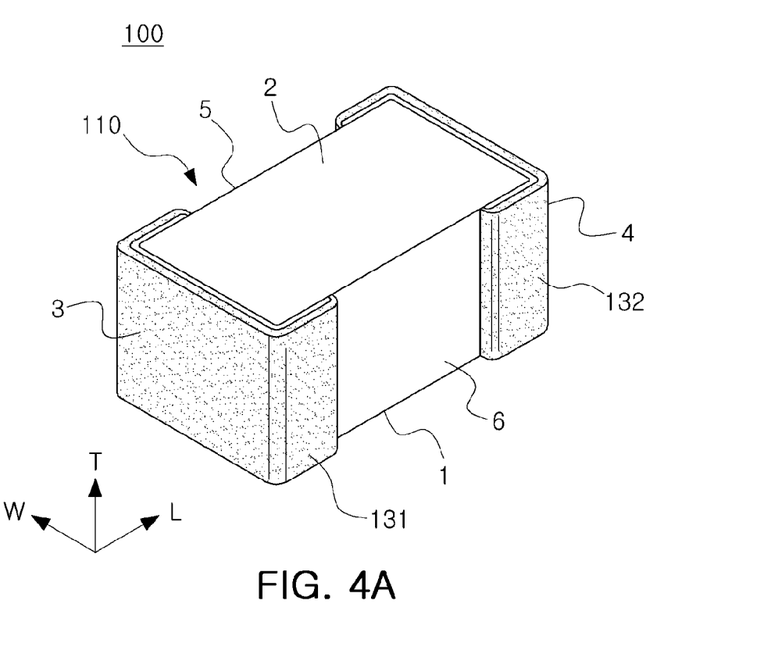
FIG. 4A is a perspective view of a multilayer ceramic capacitor according to a third exemplary embodiment of the present disclosure.
Figure 4B:
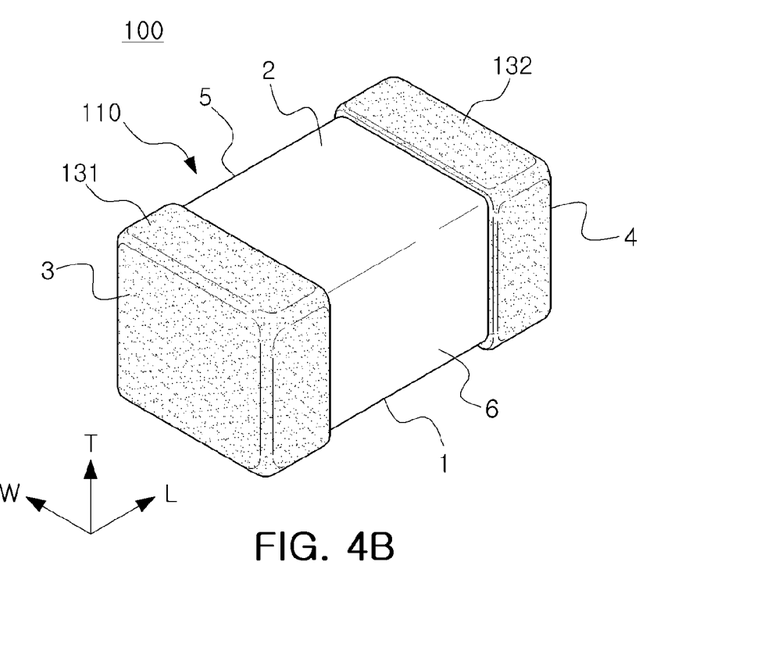
FIG. 4B is a perspective view of a multilayer ceramic capacitor according to a fourth exemplary embodiment of the present disclosure.
Figure 5A:
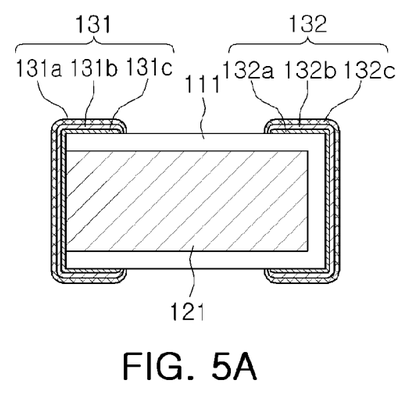
FIGS. 5A through 5D are cross-sectional plan views showing dispositions and connections of first to fourth internal electrodes and first and second external electrodes in a multilayer ceramic capacitor according to a fifth exemplary embodiment of the present disclosure.
Figure 5B:
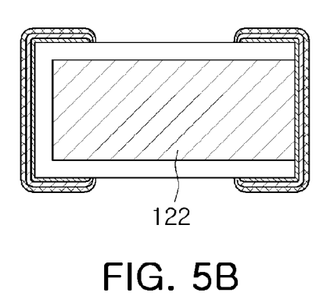
Figure 5C:
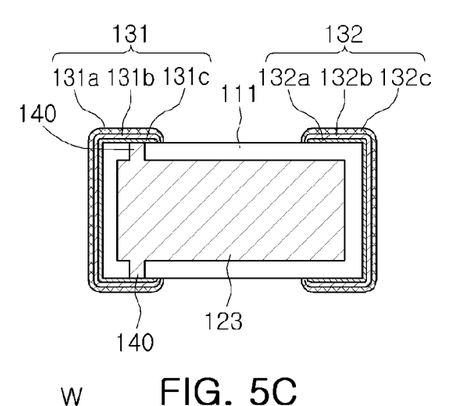
Figure 5D:
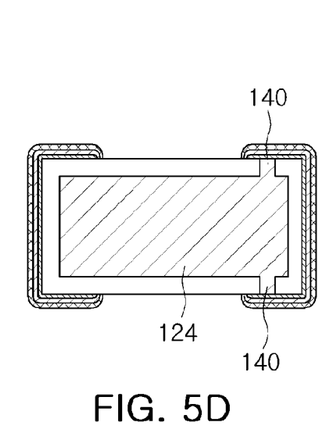
Figure 6A:
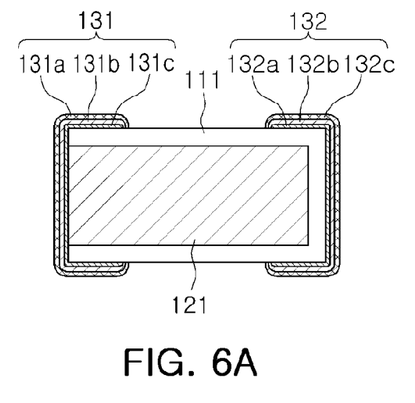
FIGS. 6A through 6D are cross-sectional plan views showing dispositions and connections of first to fourth internal electrodes and first and second external electrodes in a multilayer ceramic capacitor according to a sixth exemplary embodiment of the present disclosure.
Figure 6B:
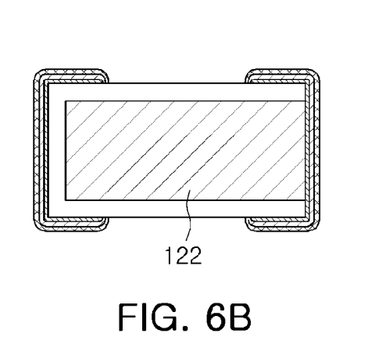
Figure 6C:
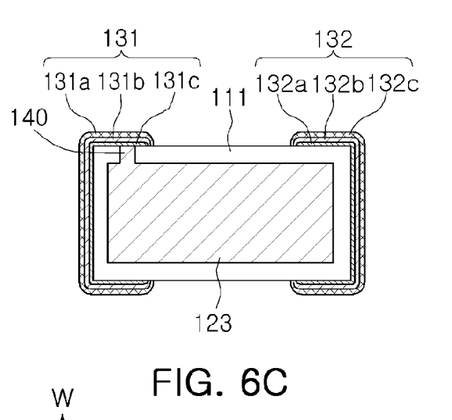
Figure 6D:
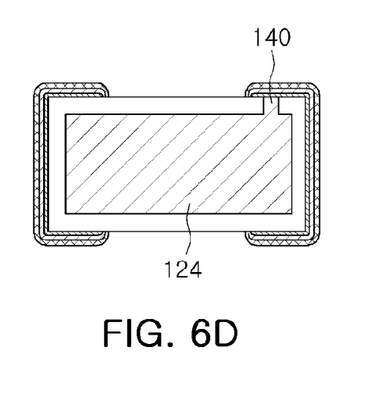
Figure 7A:
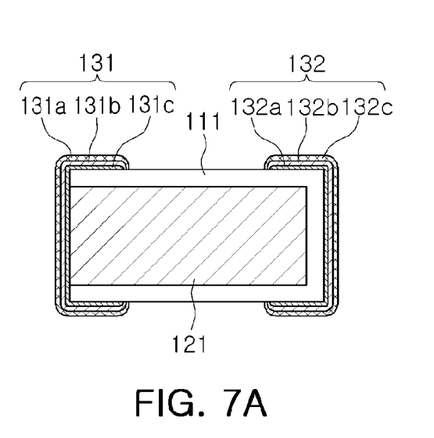
FIGS. 7A through 7D are cross-sectional plan views showing dispositions and connections of first to fourth internal electrodes and first and second external electrodes in a multilayer ceramic capacitor according to a seventh exemplary embodiment of the present disclosure.
Figure 7B:
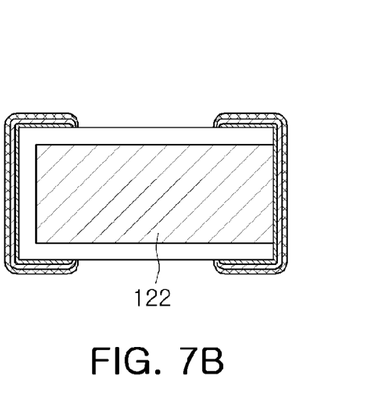
Figure 7C:
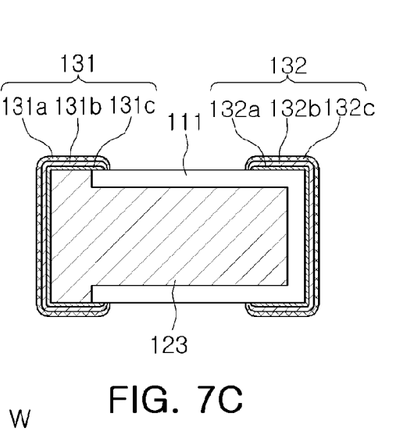
Figure 7D:
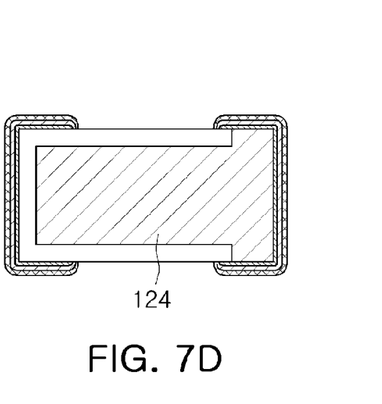
Figure 8A:
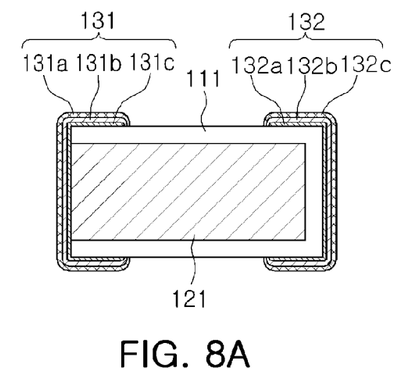
FIGS. 8A through 8D are cross-sectional plan views showing dispositions and connections of first to fourth internal electrodes and first and second external electrodes in a multilayer ceramic capacitor according to an eighth exemplary embodiment of the present disclosure.
Figure 8B:
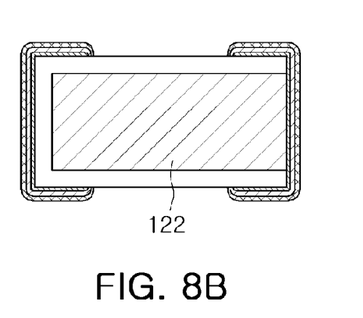
Figure 8C:
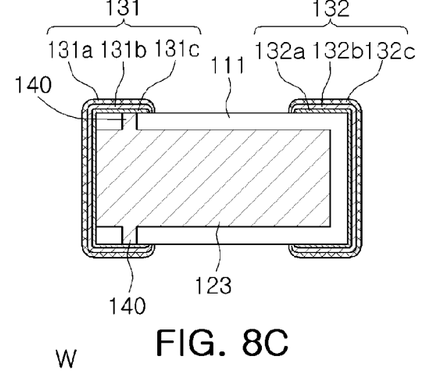
Figure 8D:
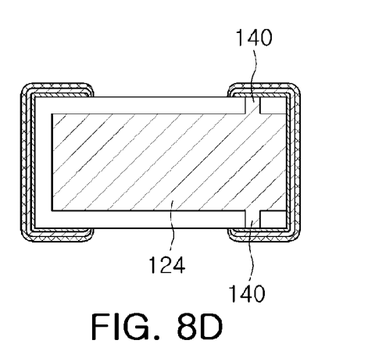
Figure 9A:
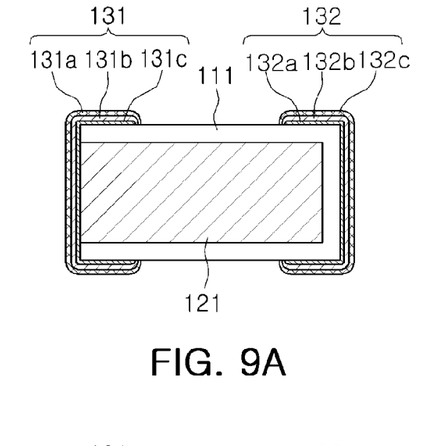
FIGS. 9A through 9D are cross-sectional plan views showing dispositions and connections of first to fourth internal electrodes and first and second external electrodes in a multilayer ceramic capacitor according to a ninth exemplary embodiment of the present disclosure.
Figure 9B:
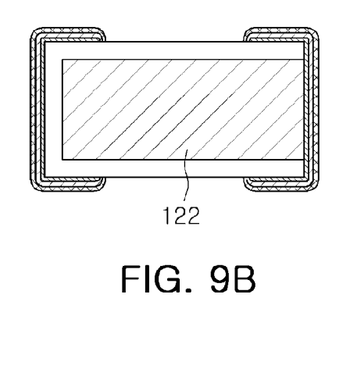
Figure 9C:
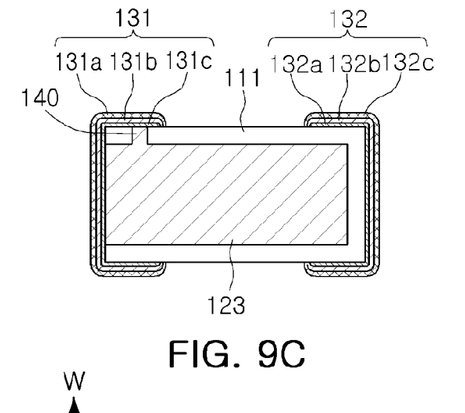
Figure 9D:
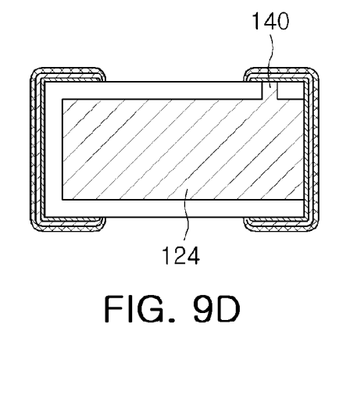

FIGS. 4A and 4B are perspective views of multilayer ceramic capacitors according to third and fourth exemplary embodiments of the present disclosure and show examples of dispositions of first and second external electrodes.

The first and second external electrodes 131 and 132 may only be disposed on the first and second end surfaces of the ceramic body 110, respectively, except for the first and second main surfaces and the first and second side surfaces of the ceramic body 110. Alternatively, referring to FIG. 4A, the first and second external electrodes 131 and 132 may be extended from the first and second end surfaces to portions of the first and second side surfaces, except for the first and second main surfaces. Alternatively, referring to FIG. 4B, the first and second external electrodes 131 and 132 may be extended from the first and second end surfaces to portions of the first and second main surfaces and the first and second side surfaces. The dispositions of the first and second external electrodes 131 and 132 are not limited thereto, and the first and second external electrodes 131 and 132 may be variously disposed.

FIGS. 5A through 5D are cross-sectional plan views showing dispositions and connections of first to fourth internal electrodes and first and second external electrodes in a multilayer ceramic capacitor according to a fifth exemplary embodiment of the present disclosure. In detail, FIGS. 5A through 5D are cross-sectional plan views of the first to fourth internal electrodes stacked on dielectric layers, respectively, taken in a length-width direction.

Referring to FIGS. 5A through 5D, in the multilayer ceramic capacitor 100 according to the fifth exemplary embodiment of the present disclosure, the first and second external electrodes 131 and 132 may be extended to portions of the side surfaces of the ceramic body 110, and the third and fourth internal electrodes 123 and 124 may further include a lead part 140 exposed to the side surfaces of the ceramic body 110 to thereby be connected to portions of the first and second external electrodes 131 and 132 which are extended to the portions of the side surfaces of the ceramic body 110. In addition, the third and fourth internal electrodes 123 and 124 may be spaced apart from both end surfaces of the ceramic body 110 such that they are not exposed to the outside of the ceramic body 110.

A shape and disposition of the lead part 140 of the third and fourth internal electrodes 123 and 124 are not limited to those illustrated in FIG. 5, and may be varied.

The third and fourth internal electrodes 123 and 124 may be connected to the first and second external electrodes 131 and 132 through the lead part 140 exposed to the side surfaces of the ceramic body 110. Therefore, a connection area of the internal electrode part 120 with the first and second external electrodes 131 and 132 may be adjusted by preventing the third and fourth internal electrodes 123 and 124 from being connected to portions of the first and second external electrodes 131 and 132 formed on both end surfaces of the ceramic body 110. In addition, a current path may be adjusted by the shape and disposition of the lead part 140.

In the case of adjusting the shape and disposition of the lead part 140 of the third and fourth internal electrodes 123 and 124 and the dispositions of the first to fourth internal electrodes 121 to 124 to reduce the connection area between the internal electrodes and the external electrodes, a decrease in ESR may be suppressed and the ESR may be appropriately maintained.

FIGS. 6A through 6D are cross-sectional plan views showing dispositions and connections of first to fourth internal electrodes and first and second external electrodes in a multilayer ceramic capacitor according to a sixth exemplary embodiment of the present disclosure. In detail, FIGS. 6A through 6D are cross-sectional plan views of the first to fourth internal electrodes stacked on dielectric layers, respectively, taken in a length-width direction.

Referring to FIGS. 6A through 6D, in the multilayer ceramic capacitor 100 according to the sixth exemplary embodiment of the present disclosure, the lead part 140 of the third and fourth internal electrodes 123 and 124 may be exposed to one side surface of the ceramic body 110 to thereby be connected to the first and second external electrodes 131 and 132, and may be spaced apart from both end surfaces of the ceramic body 110 to thereby not be exposed to the end surfaces of the ceramic body 110.

A connection area and a current path may be controlled by adjusting the shape and disposition of the lead part 140. The lead part 140 does not need to be exposed to both side surfaces of the ceramic body 110, but may be exposed to any one side surface of the ceramic body 110 to thereby be connected to the first and second external electrodes 131 and 132.

FIGS. 7A through 7D are cross-sectional plan views showing dispositions and connections of first to fourth internal electrodes and first and second external electrodes in a multilayer ceramic capacitor according to a seventh exemplary embodiment of the present disclosure. In detail, FIGS. 7A through 7D are cross-sectional plan views of the first to fourth internal electrodes stacked on dielectric layers, respectively, taken in a length-width direction.

Referring to FIGS. 7A through 7D, in the multilayer ceramic capacitor 100 according to the seventh exemplary embodiment of the present disclosure, the first and second external electrodes 131 and 132 may be extended to portions of the side surfaces of the ceramic body 110, and the third and fourth internal electrodes may be disposed to be connected to the first and second external electrodes on both end surfaces and both side surfaces of the ceramic body 110.

The third and fourth internal electrodes 123 and 124 may be exposed to the end surfaces and the side surfaces of the ceramic body 110 to thereby be connected to the first and second external electrodes 131 and 132. In this case, a connection area of the third and fourth internal electrodes 123 and 124 with the first and second external electrodes 131 and 132 may be wider than that of the first and second internal electrodes 121 and 122 with the first and second external electrodes 131 and 132.

Further, the connection area of the internal electrode part 120 with the first and second external electrodes 131 and 132 may be controlled by adjusting the shapes and dispositions of the first and second internal electrodes 121 and 122 and the third and fourth internal electrodes 123 and 124. In addition, a current path may be controlled by adjusting the shapes and dispositions of portions of the third and fourth internal electrodes 123 and 124 connected to the first and second external electrodes 131 and 132 through the side surfaces of the ceramic body 110. By adjusting the connection area and the current path as described above, ESR and ESL of the multilayer ceramic capacitor may be controlled.

FIGS. 8A through 8D are cross-sectional plan views showing dispositions and connections of first to fourth internal electrodes and first and second external electrodes in a multilayer ceramic capacitor according to an eighth exemplary embodiment of the present disclosure. In detail, FIGS. 8A through 8D are cross-sectional views of the first to fourth internal electrodes stacked on dielectric layers, respectively, taken in a length-width direction.

Referring to FIGS. 8A through 8D, in the multilayer ceramic capacitor 100 according to an eighth exemplary embodiment of the present disclosure, the first and second external electrodes 131 and 132 may be extended to portions of the side surfaces of the ceramic body 110, and the third and fourth internal electrodes 123 and 124 may be exposed to the end surfaces of the ceramic body 110 to thereby be connected to the first and second external electrodes 131 and 132. In addition, the third and fourth internal electrodes 123 and 124 may have the lead part 140 exposed to the side surfaces of the ceramic body 110 to be connected to the first and second external electrodes 131 and 132 exposed to the portions of the side surfaces of the ceramic body 110.

A shape and disposition of the lead part 140 of the third and fourth internal electrodes 123 and 124 is not limited to that shown in FIG. 8, and may be varied. For example, a connection area of the third and fourth internal electrodes with the first and second external electrodes 131 and 132 and a current path may be controlled by adjusting a width of the lead part 140. Therefore, the internal resistance and the current path may be easily adjusted, and the control of ESR and ESL may be facilitated.

FIGS. 9A through 9D are cross-sectional plan views showing dispositions and connections of first to fourth internal electrodes 121 to 124 and first and second external electrodes 131 and 132 in a multilayer ceramic capacitor according to a ninth exemplary embodiment of the present disclosure. In detail, FIGS. 9A through 9D are cross-sectional plan views of the first to fourth internal electrodes stacked on dielectric layers, respectively, taken in a length-width direction.

Referring to FIGS. 9A through 9D, in the multilayer ceramic capacitor 100 according to the ninth exemplary embodiment of the present disclosure, the lead part 140 of the third and fourth internal electrodes 123 and 124 may be disposed to be exposed to one side surface of the ceramic body 110.

The lead part 140 does not need to be exposed to both side surfaces of the ceramic body 110, but may be exposed to any one of the side surfaces of the ceramic body to thereby be connected to the first and second external electrodes 131 and 132. A connection area and a current path may be controlled by adjusting the shape and disposition of the lead part 140.

Figure 10A:
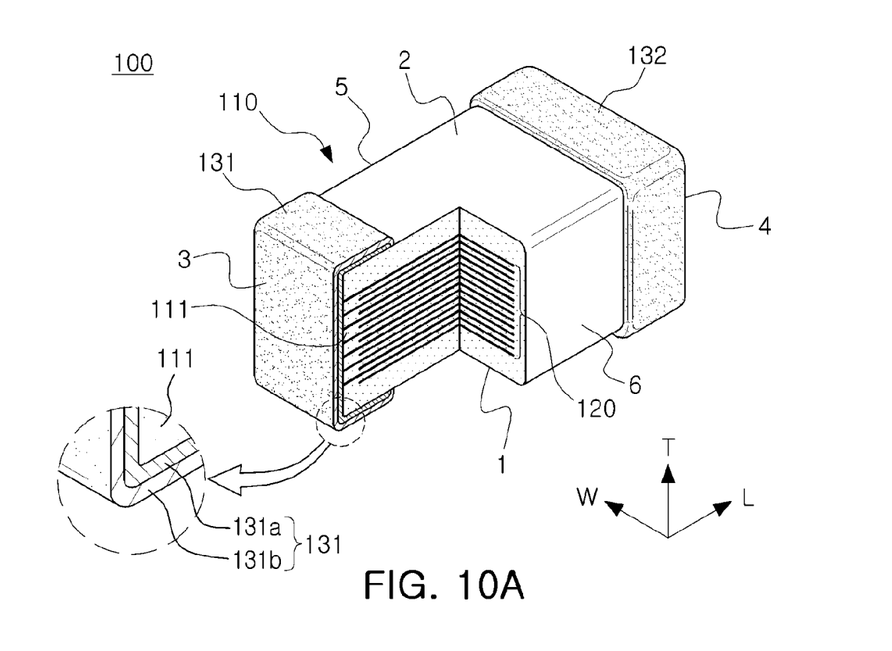
FIG. 10A is a partially cut-away perspective view of a multilayer ceramic capacitor according to a tenth exemplary embodiment of the present disclosure, and a partially enlarged view of an external electrode.
Figure 10B:
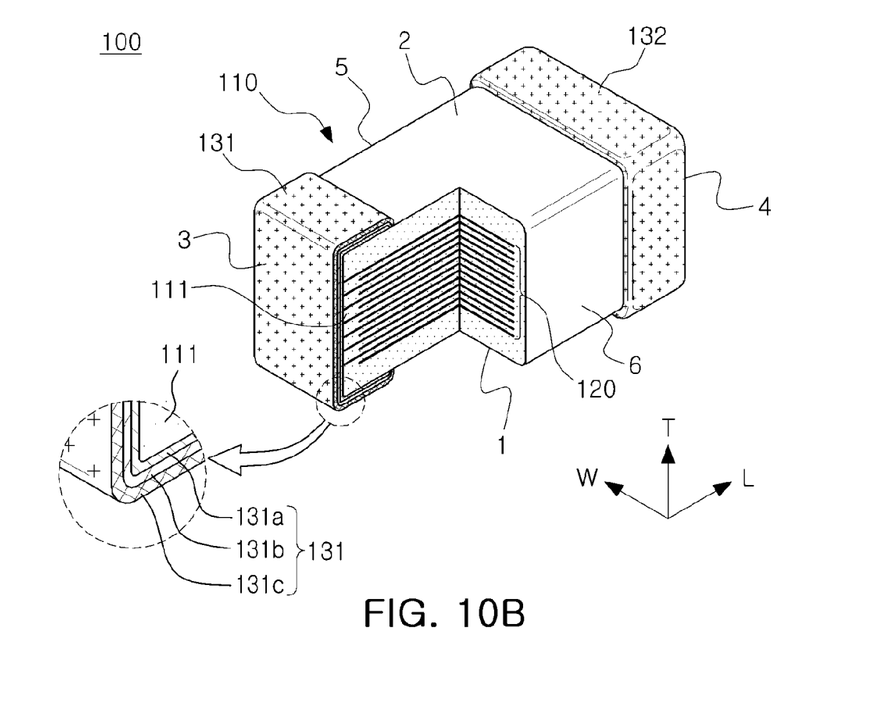
FIG. 10B is a partially cut-away perspective view of a multilayer ceramic capacitor according to an eleventh exemplary embodiment of the present disclosure, and a partially enlarged view of an external electrode.

FIG. 10A is a partially cut-away perspective view of a multilayer ceramic capacitor according to a tenth exemplary embodiment of the present disclosure, and a partially enlarged view of an external electrode; and FIG. 10B is a partially cut-away perspective view of a multilayer ceramic capacitor according to an eleventh exemplary embodiment of the present disclosure, and a partially enlarged view of an external electrode.

The first and second external electrodes 131 and 132 may include the first and second conductive layers 131a and 132a and the first and second conductive resin layers 131b and 132b.

The first and second conductive resin layers 131b and 132b may be disposed on the first and second conductive layers 131a and 132a. That is, the first and second conductive layers 131a and 132a may be disposed on outer surfaces of the ceramic body 110, and the conductive resin layers may be disposed on outer surfaces of the first and second conductive layers 131a and 132a.

Compared to the first and second conductive layers 131a and 132a, the first and second conductive resin layers 131b and 132b may contain a material having high internal resistance. In the case in which internal resistance is increased by the conductive resin layers, ESR may be increased, thereby preventing the ESR from being excessively reduced. The ESR may be controlled by adjusting thicknesses, connection areas, and compositions of the conductive layers and the conductive resin layers.

In addition, the first and second conductive resin layers formed on the first and second conductive layers 131a and 132a may serve to protect the multilayer ceramic capacitor from thermal, chemical, and physical stress, and to increase the bending strength of the multilayer ceramic capacitor. For example, the conductive resin layers may prevent moisture from infiltrating into the ceramic body 110 and prevent a plating solution from infiltrating into the ceramic body 110 at the time of forming the conductive layers. In the case in which the plating solution or moisture infiltrates into the ceramic body 110, reliability of the multilayer ceramic capacitor may deteriorate.

Referring to FIG. 10A, the first and second conductive layers 131a and 132a, which are disposed in inner portions of the first and second external electrodes 131 and 132 are connected to the internal electrodes, may contain a conductive material having relatively low internal resistance. The first and second conductive layers 131a and 132a may contain copper.

Compared to the first and second conductive layers 131a and 132a, the first and second conductive resin layers 131b and 132b disposed in outer portions of the first and second external electrodes 131 and 132 may contain a material having relatively high internal resistance. The first and second conductive resin layers 131b and 132b may contain copper-epoxy.

Referring to FIG. 10B, in the multilayer ceramic capacitor 100 according to the eleventh exemplary embodiment of the present disclosure, first and second plating layers 131c and 132c may be further disposed in the outermost portions of the first and second external electrodes 131 and 132.

The first and second plating layers 131c and 132c may allow the external electrodes of the multilayer ceramic capacitor 100 to be smoothly connected to a board in which the multilayer ceramic capacitor 100 is to be embedded. In addition, the first and second plating layers 131c and 132c, together with the first and second conductive layers 131a and 132a and the first and second conductive resin layers 131b and 132b, may adjust the internal resistance to thereby control ESR.

Figure 11:
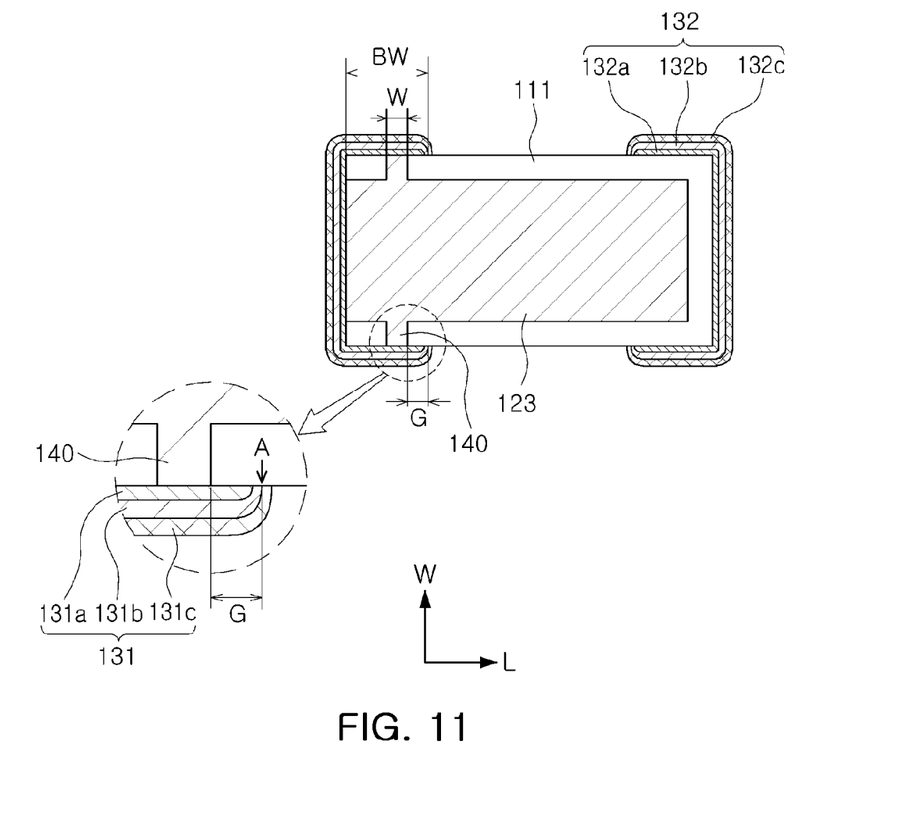
FIG. 11 is a cross-sectional plan view showing a distance between an end of a first or second conductive resin layer and a lead part in a multilayer ceramic capacitor according to an exemplary embodiment of the present disclosure.

FIG. 11 is a cross-sectional plan view showing a distance between an end of a first or second conductive resin layer and a lead part in a multilayer ceramic capacitor according to an exemplary embodiment of the present disclosure.

Referring to FIG. 11, in the first or second external electrode 131 or 132 connected to the lead part 140 of the multilayer ceramic capacitor 100 according to this exemplary embodiment of the present disclosure, when an end of a portion of the first or second conductive resin layer 131b or 132b extended to the side surface of the ceramic body 110 is defined as A, a distance from A to the end surface of the ceramic body 110 is defined as BW, a width of the lead part 140 is defined as W, and a distance from A to the lead part 140 is defined as G, a lower limit value of G may be 30 μm, and an upper limit value of G may be BW-W.

When the end of the portion of the first or second conductive resin layer 131b or 132b extended to the side surface of the ceramic body 110 is defined as A, Table 1 shows a relationship between the distance G from A to the lead part 140 and an accelerated lifespan of the multilayer ceramic capacitor 100.

TABLE 1

| Sample No. | G (μm) | Accelerated Lifespan (Defect Rate (%)) | Judgment |
|---|---|---|---|
| 1 | 10 | 50~ | Defective |
| 2 | 20 | 1~50 | Defective |

TABLE 1-continued

| Sample No. | G (μm) | Accelerated Lifespan (Defect Rate (%)) | Judgment |
|---|---|---|---|
| 3 | 30 | 0.01~1 | Good |
| 4 | 40 | ~0.01 | Good |
| 5 | 50 | ~0.01 | Good |

The results shown in Table 1 were obtained by investigating a defect rate depending on a decrease in an accelerated lifespan of the multilayer ceramic capacitor 100 for 1 hour while changing G values and applying a rated voltage under conditions of a temperature of 85° C. and a humidity of 85%.

The first and second conductive resin layers 131b and 132b may prevent moisture from infiltrating into the ceramic body 110 and prevent the plating solution from infiltrating into the ceramic body 110 at the time of forming the conductive layers. In the case in which the plating solution or moisture infiltrates into the ceramic body 110, reliability of the multilayer ceramic capacitor may deteriorate. Therefore, in the case in which the first and second conductive resin layers 131b and 132b are not sufficiently extended to the side surfaces of the ceramic body 110, the plating solution may infiltrate into the first and second conductive layers 131a and 132a or the ceramic body 110, whereby the accelerated lifespan of the multilayer ceramic capacitor may be decreased due to the infiltration of the plating solution.

According to Table 1, it may be appreciated that in the case in which G was less than 30 μm, the defect rate resulting from the decrease in the accelerated lifespan of the multilayer ceramic capacitor exceeded 1%, whereby the multilayer ceramic capacitors were defective. On the contrary, in the case in which G was 30 μm or greater, the defect rate was 1% or less, determined as satisfactory results. Therefore, it may be concluded that G is 30 μm or greater.

Circuit Board in which Multilayer Ceramic Capacitor is Embedded

In a circuit board according to an exemplary embodiment of the present disclosure in which a multilayer ceramic capacitor is embedded, the embedded multilayer ceramic capacitor may include: a ceramic body in which a plurality of dielectric layers are stacked in a thickness direction; first and second external electrodes disposed on both end surfaces of the ceramic body; first and second internal electrodes connected to the first and second external electrodes, respectively, and disposed to face each other; and third and fourth internal electrodes connected to the first and second external electrodes, respectively, and disposed to face each other, a connection area of the third and fourth internal electrodes with the first and second external electrodes being different from that of the first and second internal electrodes with the first and second external electrodes, and the first and second external electrodes including first and second conductive layers disposed in inner portions thereof and first and second conductive resin layers disposed in outer portions thereof, respectively.

As set forth above, in a multilayer ceramic capacitor and a circuit board having the same according to exemplary embodiments of the present disclosure, ESR and ESL may be easily adjusted. In addition, the occurrence of an oscillating phenomenon resulting from low ESR in a power circuit, or deterioration in electrical characteristics of the multilayer ceramic capacitor caused by a relative increase in ESL due to high ESR may be solved.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
a ceramic body in which a plurality of dielectric layers are stacked in a thickness direction;
first and second external electrodes disposed on end surfaces of the ceramic body;
first and second internal electrodes connected to the first and second external electrodes, respectively, and disposed to face each other; and
third and fourth internal electrodes connected to the first and second external electrodes, respectively, and disposed to face each other, a connection area of the third and fourth internal electrodes with the first and second external electrodes being different from that of the first and second internal electrodes with the first and second external electrodes,
wherein the first and second external electrodes include first and second conductive layers disposed in inner portions thereof and first and second conductive resin layers disposed in outer portions thereof, respectively,
wherein a plurality of the first and second internal electrodes are stacked to form a first and second internal electrode part, and a plurality of the third and fourth internal electrodes are stacked to form a third and fourth internal electrode part, which is disposed above and below the first and second internal electrode part,
wherein the first and second external electrodes are extended to portions of side surfaces of the ceramic body,
wherein the third internal electrode includes a lead part exposed to at least a side surface of the ceramic body and is exposed to one end surface of the ceramic body,
wherein the fourth internal electrode includes a lead part exposed to at least a side surface of the ceramic body and is exposed to the other end surface of the ceramic body,
wherein the lead parts of the third and fourth internal electrodes are connected to the first and second external electrodes, respectively, which are extended to the portions of the side surfaces of the ceramic body.

2. The multilayer ceramic capacitor of claim 1, wherein the first and second external electrodes are extended to portions of main surfaces of the ceramic body.

3. The multilayer ceramic capacitor of claim 1, wherein the lead part is disposed to be exposed to one side surface of the ceramic body.

4. The multilayer ceramic capacitor of claim 1, wherein the first and second conductive layers contain copper.

5. The multilayer ceramic capacitor of claim 1, wherein the first and second conductive resin layers contain copper-epoxy.

6. The multilayer ceramic capacitor of claim 1, wherein the first and second external electrodes further include first and second plating layers disposed in outermost portions of the first and second external electrodes, respectively.

7. The multilayer ceramic capacitor of claim 1, wherein when an end of a portion of the first or second conductive resin layer extended to the side surface of the ceramic body is defined as A, a distance from A to the lead part is 30 μm or greater.

8. A circuit board in which a multilayer ceramic capacitor is embedded, the multilayer ceramic capacitor comprising:

a ceramic body in which a plurality of dielectric layers are stacked in a thickness direction;

first and second external electrodes disposed on both end surfaces of the ceramic body;

first and second internal electrodes connected to the first and second external electrodes, respectively, and disposed to face each other; and third and fourth internal electrodes connected to the first and second external electrodes, respectively, and disposed to face each other, a connection area of the third and fourth internal electrodes with the first and second external electrodes being different from that of the first and second internal electrodes with the first and second external electrodes, the first and second external electrodes including first and second conductive layers disposed in inner portions thereof and first and second conductive resin layers disposed in outer portions thereof, respectively, wherein a plurality of the first and second internal electrodes are stacked to form a first and second internal electrode part, and a plurality of the third and fourth internal electrodes are stacked to form a third and fourth internal electrode part, which is disposed above and below the first and second internal electrode part, wherein the first and second external electrodes are extended to portions of side surfaces of the ceramic body, wherein the third internal electrode includes a lead part exposed to at least a side surface of the ceramic body and is exposed to one end surface of the ceramic body, wherein the fourth internal electrode includes a lead part exposed to at least a side surface of the ceramic body and is exposed to the other end surface of the ceramic body, wherein the lead parts of the third and fourth internal electrodes are connected to the first and second external electrodes, respectively, which are extended to the portions of the side surfaces of the ceramic body.

* * * * *